United States Patent [19]
Miwa

[11] Patent Number: 6,043,552
[45] Date of Patent: *Mar. 28, 2000

[54] SEMICONDUCTOR DEVICE AND METHOD OF MANUFACTURING THE SEMICONDUCTOR DEVICE

[75] Inventor: Hiroyuki Miwa, Kanagawa, Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/964,649

[22] Filed: Nov. 5, 1997

[30] Foreign Application Priority Data

Nov. 5, 1996 [JP] Japan .................................... 8-292448

[51] Int. Cl.$^7$ ........................ H01L 31/18; H01L 29/540

[52] U.S. Cl. ...................... 257/587; 257/565; 257/588; 257/593; 257/382; 257/383; 257/384; 257/754; 257/755

[58] Field of Search ..................................... 257/565, 587, 257/588, 593, 382, 383, 384, 385, 754, 755, 592

[56] References Cited

U.S. PATENT DOCUMENTS

| 5,254,480 | 10/1993 | Tran | 438/59 |
|---|---|---|---|
| 5,313,084 | 5/1994 | Wei | 257/384 |
| 5,705,413 | 1/1998 | Harkin et al. | 438/155 |
| 5,742,088 | 4/1998 | Pan et al. | 257/755 |
| 5,760,451 | 6/1998 | Yu | 257/755 |

*Primary Examiner*—Leo P. Picard
*Assistant Examiner*—Hung Van Duong
*Attorney, Agent, or Firm*—Hill & Simpson

[57] ABSTRACT

In order to prevent an epitaxial layer from contamination by metal when the epitaxial layer is formed on a substrate on which a conductor film comprising a metallic film is formed, a bipolar transistor (semiconductor device) 1 has the first conductor pattern 8 comprising a high-melting metallic film or a high-melting metallic compound film formed on the substrate 4, and the second conductor pattern 9 comprising a non-metallic film formed so as to cover the first conductor pattern 8. On the substrate 4 is formed the first conductivity type base layer 10 on the semiconductor layer comprising an epitaxial layer so as to come in contact with the second conductor pattern 9. Furthermore, when manufacturing the bipolar transistor 1, the semiconductor layer as the base layer 10 is formed with the epitaxial process after the first conductor pattern 8 is covered by the second conductor pattern 9.

10 Claims, 8 Drawing Sheets

SEMICONDUCTOR DEVICE AND METHOD OF MANUFACTURING THE SEMICONDUCTOR DEVICE

BACKGROUND OF THE INVENTION

The present invention relates to a semiconductor device and a method of manufacturing the semiconductor device, more particularly to a semiconductor device and a method of manufacturing semiconductor devices comprising a bipolar transistor and a field-effect transistor respectively.

These years, semiconductor manufacturers have developed processes for manufacturing higher performance semiconductors. For example, an epitaxial base process which enables shallow junction and low resistance for semiconductor device bases has been developed for manufacturing of bipolar transistors, which is known as one of those semiconductor types. Those bases are very important for manufacturing high performance semiconductor devices. This epitaxial process can form a thin base layer of about 50 nm in high density and high accuracy.

The epitaxial process uses a silicon germanium (SiGe) mixed crystal as a base material having a band gap smaller than that of silicon for a practical heterojunction structure. In the case of the heterojunction, the injection efficiency of carriers into a base from an emitter can be improved more than the homojunction. Thus, a current amplification factor $h_{FE}$ can be secured without increasing the base resistance and the carrier transition time between emitter and base, resulting in high performance bipolar transistors.

On the other hand, low resistance of a base lead-out electrode is also an important item for high performance bipolar transistors. Conventionally, it is considered to be effective to form part of the base lead-out electrode with high-melting metal whose resistance is lower than that of polysilicon for making the resistance of a base lead-out electrode low.

In the case of manufacturing of bipolar transistors using the epitaxial base process, for example, a base leadout electrode is formed on a substrate, then a base layer comprising an epitaxial layer is formed on the substrate so as to come in contact with the base lead-out electrode.

When manufacturing such a bipolar transistor, however, a heat treatment of 600 to 800° C. is needed for growing an epitaxial layer, which becomes a base layer. So, when a base lead-out electrode is formed with high-melting metal, the high-melting metal in the base lead-out electrode is captured by the epitaxial layer during the epitaxial growth, causing a problem that the epitaxial layer is contaminated. And, when the base layer comprising the epitaxial layer is contaminated, the life time of the carriers contained in the base goes down, causing the deterioration of the electrical property that the base current is increased and the current amplification factor $h_{FE}$ goes down.

SUMMARY OF THE INVENTION

In order to solve the above problems, the first semiconductor device according to the present invention comprises a substrate, the first conductor pattern comprising a high-melting metallic film or a high-melting metallic compound film formed on the substrate, the second conductor pattern comprising a non-metallic film covering the first conductor pattern, and a semiconductor layer comprising an epitaxial layer formed on the substrate so as to come in contact with the second conductor pattern.

In this semiconductor device, a semiconductor layer is formed so as to come in contact with the second conductor pattern covering the first conductor pattern, the first conductor pattern is already covered by a non-metallic second conductor pattern in an epitaxial growth process for forming the semiconductor layer. Consequently, in the above epitaxial growth process, diffusion of the high-melting metal, which is an element of the first conductor pattern, into the semiconductor layer can be prevented almost completely by the second conductor pattern, so that contamination of the semiconductor layer caused by capturing high-melting metal from the first conductor pattern can be prevented.

Furthermore, since the first conductor pattern comprises a high-melting metallic film or a high-melting metallic compound film whose resistance is far lower than that of polysilicon used usually for a base lead-out electrode, the resistance of the base lead-out electrode can be much reduced if the semiconductor device is a bipolar transistor and both the above first and second conductor patterns or the above first conductor pattern is a base lead-out electrode.

The second semiconductor device according to the present invention comprises a field-effect transistor manufactured on a substrate. The semiconductor device comprises first conductor patterns comprising high-melting metallic films or high-melting metallic compound films formed on the substrate with a space left between each of the first conductor patterns; second conductor patterns comprising a non-metallic film formed for each of the first conductor patterns with the second pattern covering the first conductor pattern; and a semiconductor layer comprising an epitaxial layer formed on the second conductor patterns so as to come in contact with each of the second conductor patterns. In the surface of the semiconductor layer source/drain parts are formed with a space left between each of the source/drain parts is connected to each of the second conductor patterns.

Since a semiconductor layer is formed on the second conductor pattern covering the first conductor pattern in this semiconductor device, the first conductor pattern is already covered by the non-metallic second conductor pattern in an epitaxial growth process for forming the semiconductor layer. Consequently, in the above epitaxial growth process, diffusion of the high-melting metal, which is an element of the first conductor pattern, into the semiconductor layer can be prevented almost completely by the second conductor pattern, so that contamination of the channel part formed between source and drain of the semiconductor layer, caused by the high-melting metal captured from the first conductor pattern can be prevented effectively.

In the first method of manufacturing the semiconductor device according to the present invention, at first the first conductor pattern comprising a high-melting metallic film or a high-melting metallic compound film is formed on a substrate. Then, the second conductor pattern comprising a non-metallic film is formed so as to cover the first conductor pattern, and furthermore, a semiconductor layer is formed on the substrate with an epitaxial process so as to come in contact with the second conductor pattern.

Since a semiconductor layer is formed with an epitaxial process after the first conductor pattern is covered by the second conductor pattern, diffusion of the high-melting metal, which is an element of the first conductor pattern, into the semiconductor layer can be prevented almost completely by the second conductor pattern in the epitaxial growth process, and accordingly, the above high-melting metal is not captured by the semiconductor layer.

Furthermore, if, when the semiconductor layer is patterned with an etching process, the semiconductor layer is formed with a material whose etch characteristics selectively differs from that of the second conductor pattern, the second conductor pattern functions as an etching stopper layer. In addition, if the second conductor pattern is formed with a material whose etch characteristics selectively differs from that of the first conductor pattern, the first conductor pattern functions as an etching stopper layer when the semiconductor layer and the second conductor pattern are patterned with an etching process.

The second method according to the present invention is a method of manufacturing a semiconductor device comprising a field-effect transistor. At first, first conductor patterns comprising a high-melting metallic film or a high-melting metallic compound film are formed on a substrate with a space left between each of the first conductor patterns. Then, a second conductor pattern comprising a non-metallic film is formed for each of the first conductor patterns so as to cover the first conductor pattern. After this, a semiconductor layer is formed on the second conductor patterns with an epitaxial process so as to come in contact with each of the second conductor patterns. Then, impurities are injected into the semiconductor layer to form source/drain parts with a space left between each of the source/drain parts so that each of the source/drain parts is connected to each of the second conductor patterns.

Since the semiconductor layer is formed with an epitaxial process after the first conductor patterns are covered by the second conductor patterns in this method, diffusion of the high-melting metal, which is an element of the first conductor pattern, into the semiconductor layer can be prevented almost completely by the second conductor patterns in this epitaxial growth process, and accordingly, the above high-melting metal is not captured by diffusing into the semiconductor layer. Thus, a channel part free from contamination by the above metal can be formed between source and drain of the semiconductor layer.

DESCRIPTION OF THE PREFERRED EMBODIMENTS

Hereunder, a semiconductor device and a method of manufacturing the semiconductor device according to the present invention will be explained with reference to the attached drawings.

Figure 1:
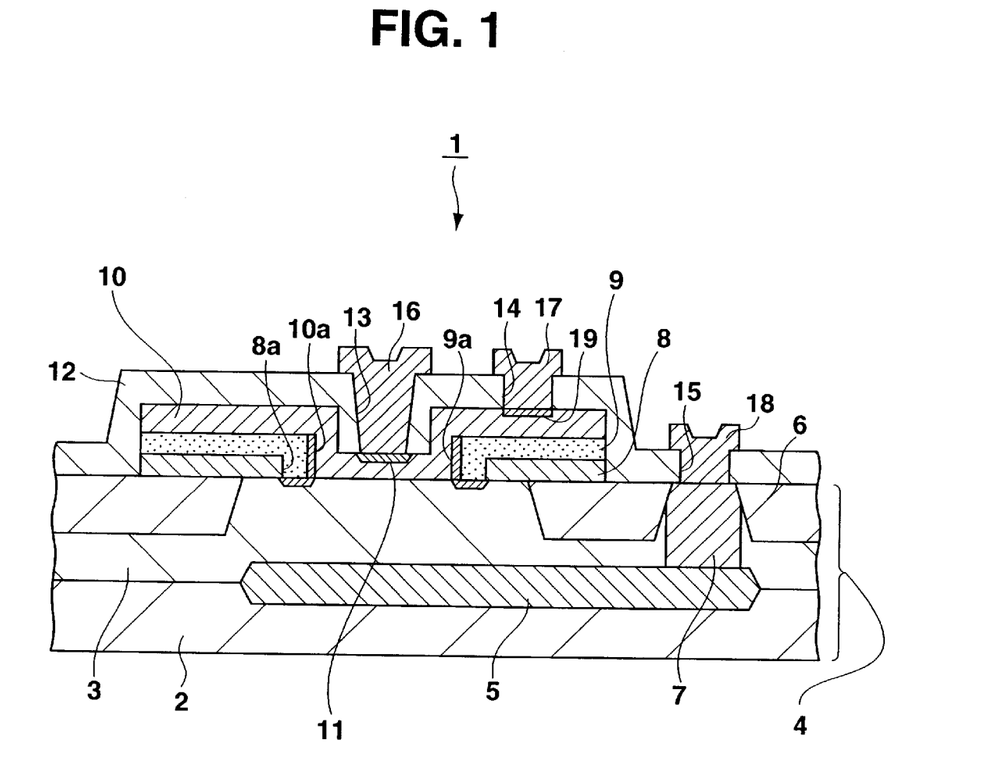
FIG. 1 is a side cross sectional view showing the major portion of the first embodiment of the first semiconductor device according to the present invention.

FIG. 1 is a side cross sectional view showing the major portion of the first embodiment of the first semiconductor device according to the present invention. In this embodiment, it is assumed that the first semiconductor device is a bipolar transistor. The first conductivity type will be referred to as P-type and the second conductivity type as N-type respectively.

The bipolar transistor 1 shown in FIG. 1 comprises a substrate 4 comprising a P-type silicon (Si) substrate 2 and an N$^-$-type epitaxial layer 3 formed on this substrate. An N$^+$-type collector region 5 is formed between the Si substrate 2 and the epitaxial layer 3. On the epitaxial layer 3 is formed an isolation film 6 comprising, for example, a LOCOS (Local Oxidation of Silicon) oxide film. This film 6 isolates the collector region from the collector lead-out region on the epitaxial layer 3, as well as the bipolar transistor 1 from other elements. In the collector lead-out region of the epitaxial layer 3 is formed an N$^+$-type collector lead-out layer 7 connected to the collector region 5.

On such a substrate 4 is formed the first conductor pattern 8 comprising a high-melting metallic film or a high-melting metallic compound film. This first conductor pattern 8 is provided with an opening 8a in the collector region of the epitaxial layer 3 and formed in the pattern of the base layer 10 (to be described later). The high-melting metallic film used for the first conductor pattern 8 is, for example, molybdenum (Mo), tungsten (W) and titanium (Ti). The high-melting metallic compound film used for the first conductor pattern 8 is, for example, a high-melting metallic silicide film such as molybdenum silicide (MoSix), tungsten silicide (WSix), and titanium silicide (TiSix). In this embodiment, WSix is used to form the first conductor pattern 8.

On the substrate 4 is formed the second conductor pattern 9 covering the side wall of the opening 8a of the first conductor pattern 8 and the face of the first conductor pattern 8 and provided with an opening 9a in the collector region of the epitaxial layer 3. The second conductor pattern 9 comprises a non-metallic film, for example, a P$^+$-type polysilicon film injected with P impurities at a high density.

In the collector region formed on the substrate 4 is formed a semiconductor layer 10 comprising a P-type epitaxial layer so as to be connected to the second conductor pattern 9. In this embodiment, the semiconductor layer 10 is formed so as to cover both the inner wall of the opening 9a and the face of the second conductor pattern 9. This semiconductor layer 10 is assumed as the base layer (hereinafter, the semiconductor layer 10 will be referred to as the base layer 10) of the bipolar transistor 1. For example, the base layer 10 is formed with a mixed crystal of silicon germanium (SiGe).

An N$^+$-type emitter layer 11 is also formed on part of the layer formed on the base layer 10.

On the substrate 4 is also formed an insulating film 12 comprising silicon oxide (SiOx) so as to cover the base layer 10, the first conductor pattern 8, and the edge of the second conductor pattern 9. And, a cap layer comprising an Si epitaxial layer (not illustrated) is formed between the base layer 10 and the insulating film 12 to suppress the out-diffusion of Ge from the base layer 10.

In the surface of the insulating film 12 are formed the first contact hole 13 communicating with the emitter layer 11, the second contact hole 14 communicating with the base layer 10, and the third contact hole communicating with the collector lead-out layer 7, respectively. On the insulating film 12 are formed an emitter electrode 16 connected to the emitter layer 11 through the first contact hole 13, the base electrode 17 connected to the base layer 10 via the second contact hole 14, and a collector electrode 18 connected to the collector lead-out layer 7 through the third contact hole 15, respectively.

Each of the emitter electrode 16, the base electrode 17, and the collector electrode 18 comprises, for example, barrier metal and aluminum (Aℓ) metal. At the junction between the base layer 10 and the base electrode 17 formed on the base layer 10 is formed a $P^+$-type high density impurity layer 19 used to lower the resistance at this portion.

Subsequently, the first embodiment of the first method of manufacturing a semiconductor device according to the present invention will be explained with reference to FIG. 2 on the basis of the method of manufacturing the bipolar transistor 1 formed as described above.

Figure 2A:
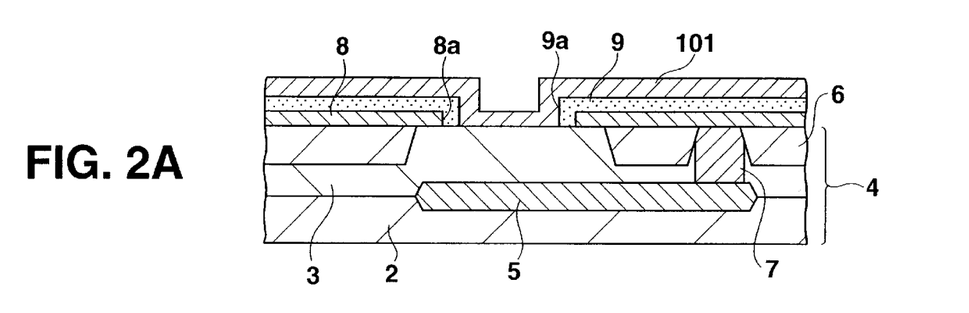
FIG. 2A to FIG. 2D are side cross sectional views of the major portion of the first semiconductor device showing the successive steps in the first embodiment of the first method of manufacturing a semiconductor device according to the present invention.

Before manufacturing the bipolar transistor 1, a substrate 4 as shown in FIG. 2A is prepared with an existing method.

In other words, on the substrate 4, an $N^+$-type collector region 5 is formed on the face of the P-type Si substrate 2. Then, an $N^-$-type epitaxial layer 3 is formed on the Si substrate 2 so as to cover the collector region 5. Furthermore, an isolation film 6 is formed on the epitaxial layer 3. The film 6 isolates the collector region of the epitaxial layer 3 from the collector lead-out region, as well as the bipolar transistor 1 from other elements. And, in the collector lead-out region of the epitaxial layer 3 is formed an $N^+$-type collector lead-out layer 7 connected to the collector region 5.

In this embodiment, at first a WSix film is formed on the substrate 4 with, for example, a chemical vapor growth (hereinafter described to as CVD) method. Then, the WSix film is patterned with lithographic and etching processes to form the first conductor pattern 8 provided with an opening 8a in the collector region as shown in FIG. 2A.

After this, a polysilicon film is formed on the substrate 4 so as to cover the first conductor pattern with the CVD method. Subsequently, P-type impurities are ion-implanted in the polysilicon film entirely at a high density with an ion-implantation method. A $P^+$-type polysilicon film may also be formed by implanting P-type impurities in the polysilicon film with the above CVD method when the polysilicon film is formed.

Then, the polysilicon film is patterned with lithographic and etching processes to form the second conductor pattern 9 so as to cover the first conductor pattern 8 and so as to be provided with an opening 9a in the collector region.

After this, a semiconductor layer 101 comprising a SiGe mixed crystal is grown selectively on the second conductor pattern 9 with the epitaxial process so as to cover the inner wall of the opening 9a of the second conductor pattern to form a cap layer (not illustrated) comprising an Si epitaxial layer on the semiconductor layer 101 used for forming the base.

The temperature of the substrate 4 is set to, for example, 600 to 800° C. to accelerate the epitaxial growth of the semiconductor layer 101 and the cap layer. As a material gas for forming the cap layer, for example, a silane gas, such as mono-silane ($SiH_4$), dichlorosilane ($SiH_2Cl_2$), trichlorosilane ($SiHCl_3$), and disilane ($Si_2H_6$), is used. As a Ge material gas for forming the SiGe semiconductor layer 10, the same gas as that for forming the cap layer is used.

Figure 2B:
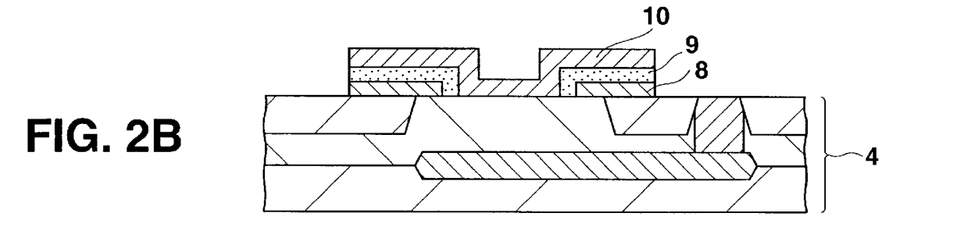

After this, the first conductor pattern 8, the second conductor pattern 9, a semiconductor layer 101, and a cap layer are formed on the pattern of the base layer 10 with lithographic and etching processes as shown in FIG. 2B. With this, the base layer 10 comprising an SiGe mixed crystal semiconductor layer 101 is obtained.

Figure 2C:
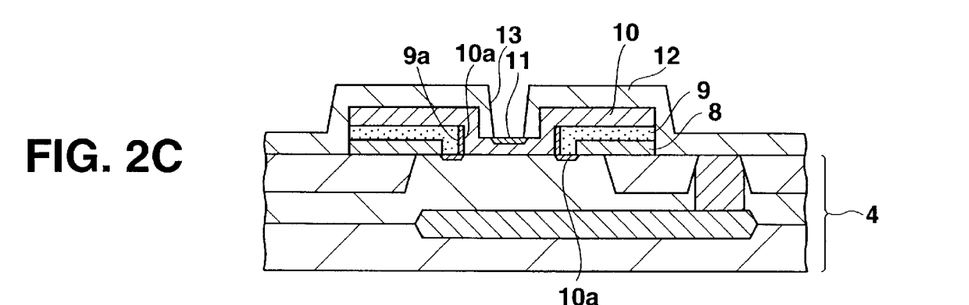

Then, for example, an insulating film 12 comprising an SiOx film is formed on the substrate 4 so as to cover the base layer 10, the first conductor pattern 8, and an edge of the second conductor 9 with the CVD method as shown in FIG. 2C.

Furthermore, the first contact hole 13 is formed in the insulating film 12 so as to expose the face of the base layer 10 to external at a position where the emitter layer 11 is formed with lithographic and etching processes.

Subsequently, N-type impurities are implanted in the base layer 10 with, for example, the ion-implantation method, then the implanted impurities are activated with a heat-treatment to form an $N^+$-type emitter layer 11 on part of the base layer 10. With this heat treatment, impurities implanted in the second conductor pattern 9 are diffused, so that a $P^+$-type diffusion part 10a is formed so as to come in contact with the side wall of the opening 9a of the second conductor pattern 9 on the base layer 10 and with the second conductor pattern 9 on the substrate 4, respectively.

Figure 2D:
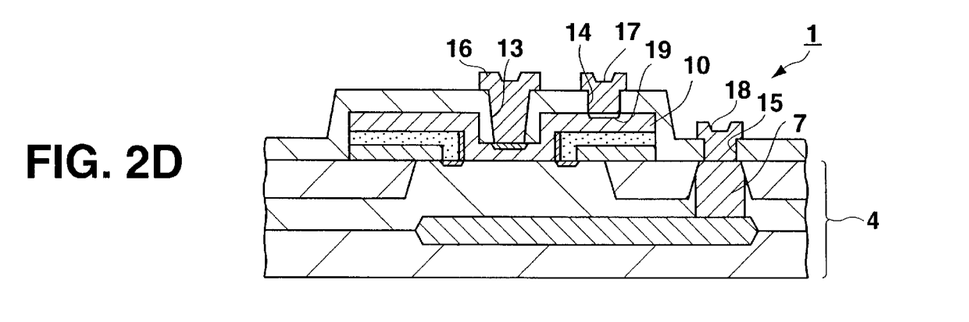

After this, the second contact hole 14 is formed in the insulating film 12 so as to communicate with the base layer 10 as shown in FIG. 2D, as well as the third contact hole 15 is formed so as to communicate the collector lead-out layer 7 of the substrate 4.

Subsequently, a resist pattern to which the second contact hole 14 is opened is formed on the insulating film 12, then P-type impurities are implanted into the base layer 10 formed in the second contact hole 14 with the ion-implantation method to form a $P^+$-type high density impurity layer 19. After this, the resist pattern is removed.

Then, an emitter electrode 16 is formed on the insulating film 12 with an existing wiring process so as to be connected to the emitter layer through the first contact hole 13, as well as a base electrode 17 is formed so as to be connected to the high density impurity layer 19 of the base layer through the second contact hole 14. And furthermore, a collector electrode 18 is formed so as to be connected to the collector lead-out layer 7 through the third contact hole 15.

In the method of manufacturing this bipolar transistor 1, after the first conductor pattern 8 is covered by the second conductor pattern 9 made of non-metallic polysilicon, the semiconductor layer 101 for forming the base layer 10 is epitaxial-grown. Consequently, diffusion of W, which is an element of the first conductor pattern 8, is prevented almost completely by the second conductor pattern 9, so that drawing of the W into the semiconductor layer 101 can be prevented even when heat is applied to the substrate 4 while a semiconductor layer 101 is formed on the substrate 4 so as to be connected to the second conductor pattern 9. As a result, deterioration of the electrical property of the bipolar transistor can be prevented. The deterioration is caused by a drop of the current amplification factor $h_{FE}$ due to the metallic contamination of the base layer comprising a semiconductor layer 101.

Furthermore, since an SiGe mixed crystal whose band gap is smaller than Si is used to form the base layer 10 and a heterojunction is formed between emitter and base, deterioration of the electrical property is prevented, while the high performance NPN type heterojunction bipolar transistor (HBT) 1 can be manufactured.

In the bipolar transistor 1 manufactured as described above, the base layer 10 is free from contamination of W from the first conductor pattern 8. Moreover, since the base layer 10 comprises an SiGe mixed crystal and a heterojunction is formed between emitter and base, an NPN type bipolar transistor 1 with proper electrical property and high performance can be materialized.

In the above embodiment, an ion-implantation method is used to form an emitter layer 11. However, another method such as plasma doping and vapor diffusion may also be used to form the emitter layer 11. In addition, the following method may also be used to form the emitter layer 11.

Figure 3:
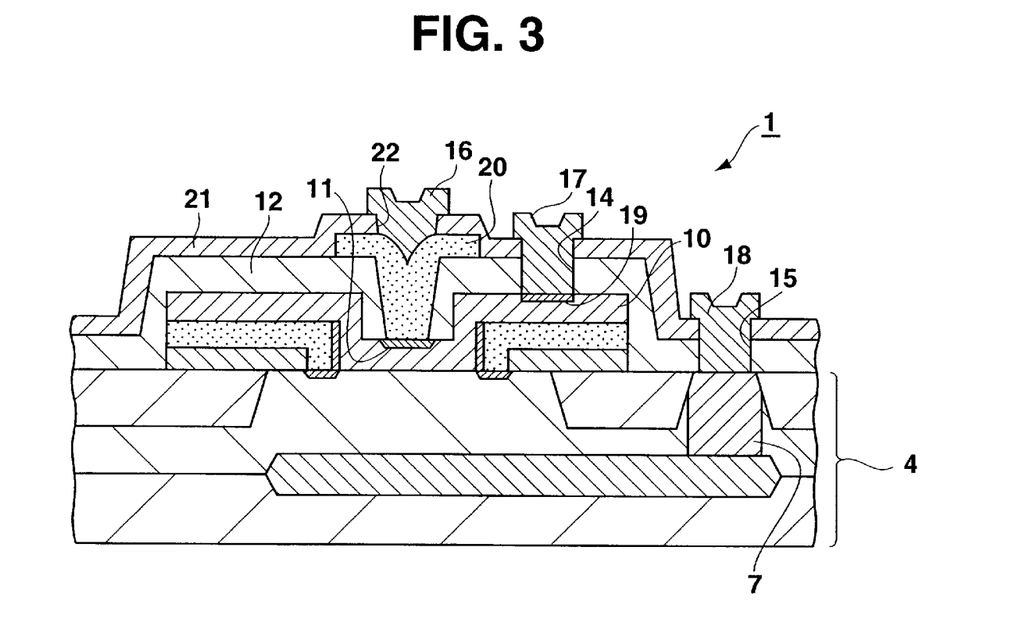
FIG. 3 is a cross sectional view showing the major portion of a modification of the first embodiment of the first semiconductor device.

In other words, the first contact hole 13 is formed in the insulating film 12, then an emitter lead-out layer 20 comprising, for example, polysilicon into which N-type impurities are implanted at a high density is formed so as to cover the inner wall of the first contact hole 13 as shown in FIG. 3. After this, the impurities from the emitter lead-out layer 20 are diffused in the surface of the base layer 10 with a heat treatment to form an emitter layer 11.

When the emitter layer 11 is formed such way, an upper insulating layer 21 is formed on the insulating film 12 so as to cover the emitter lead-out layer 20 later. Then, a contact hole 22 is formed so as to communicate with the upper insulating film 21, and furthermore, the second contact hole 14 connected to the base layer 10, as well as the third contact hole 15 connected to the collector lead-out layer 7 are formed in the upper insulating film 21 and in the insulating film 12 respectively. After this, a P$^+$-type high density impurity layer 19 is formed on the base layer 10 formed in the second contact hole 14, then an emitter electrode 16 is formed on the upper insulating film 21 so as to be connected to the emitter lead-out layer 20 through the contact hole 22. Moreover, when the emitter electrode 16 is formed, both the base electrode 17 and the collector electrode 18 are also formed.

Consequently the bipolar transistor 1 in the first embodiment may be replaced with a double polysilicon structured NPN type bipolar transistor 1 as shown in FIG. 3.

Figure 4:
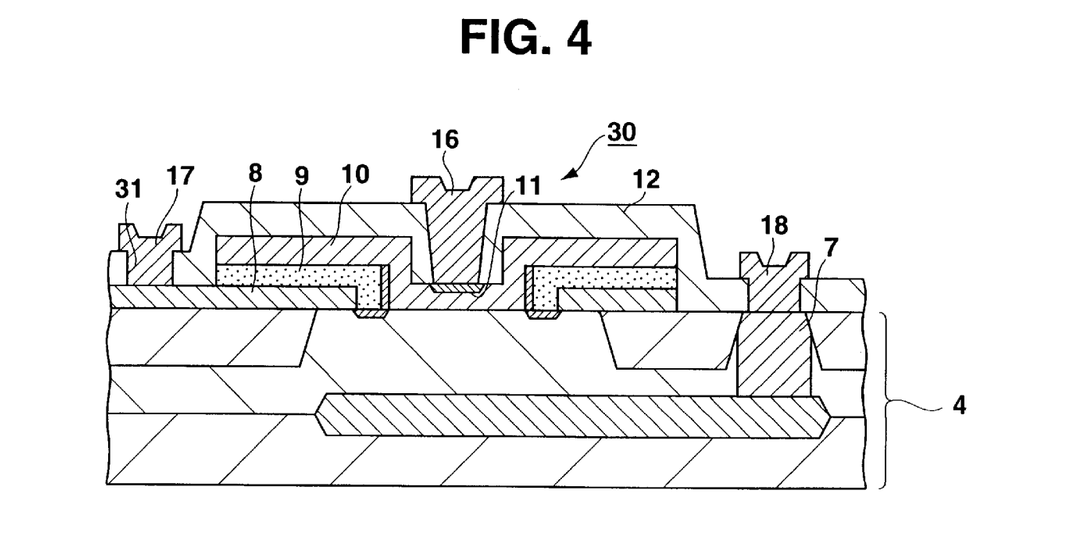
FIG. 4 is a side cross sectional view showing the major portion of the second embodiment of the first semiconductor device according to the present invention.

Subsequently, the second embodiment of the first semiconductor device according to the present invention will be explained with reference to FIG. 4.

In the bipolar transistor 30, which is a semiconductor device in this second embodiment, there is only a difference from the bipolar transistor 1 in the first embodiment. The difference is that the first conductor pattern 8 is used as a base lead-out electrode.

In other words, the first conductor pattern 8 comprising, for example, WSix, is extended outside the periphery of the base layer 10 so as to be formed in the base lead-out electrode pattern.

Then, an insulating film 12 is formed on the substrate 4 so as to cover the first conductor pattern 8, which is this base lead-out electrode, as well as the base layer 10 and the edge of the second conductor pattern 9. And, in the insulating film 12 is formed a contact hole 31 communicating with the first conductor pattern 8. And, on the insulating film 12 is formed a base electrode 17 connected to the first conductor pattern 8 through this contact hole 31. On the insulating film 12 are also formed an emitter electrode 16 and a collector electrode 18 just like in the first embodiment.

In the bipolar transistor 30 formed as described above, the first conductor pattern 8, which is a base lead-out electrode, is formed with WSix whose resistance is lower than that of polysilicon used as a base lead-out electrode material conventionally, so that the resistance of the first conductor pattern 8 is much lowered. This is why a higher performance NPN type heterojunction bipolar transistor 30 can be materialized.

In this second embodiment, the first conductor pattern 8 comprises WSix, but a base lead-out electrode may also be formed, for example, in the first conductor pattern 8 and the second conductor pattern 9. In this case, since the resistance of the base lead-out electrode is lowered, the same effect as the above can be obtained.

Figure 5A:
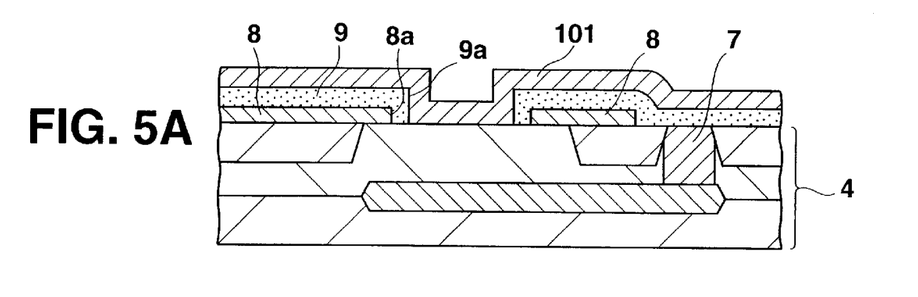
FIG. 5A to FIG. 5C are side cross sectional views of the major portion of the first semiconductor device showing the successive steps on the second embodiment of the first method of manufacturing a semiconductor device according to the present invention.

Subsequently, the second embodiment of the first method of manufacturing a semiconductor device according to the present invention will be explained with reference to FIG. 5 on the basis of the method of manufacturing the bipolar transistor 30 formed as described above.

When manufacturing the bipolar transistor 30, at first the first conductor pattern 8 provided with an opening 8a is formed on a substrate 4 prepared just like in the first embodiment. Then, a film used for the second conductor pattern 9 is formed on the substrate 4 so as to cover the first conductor pattern 8. At this time, the film used for the second conductor pattern 9 is formed with a material whose etch selectivity differs from that of the first conductor pattern 8, for example, a polysilicon film in which P-type impurities are implanted. After this, the polysilicon film is patterned with lithographic and etching processes to form the second conductor pattern 9 provided with an opening 9a in the collector region so as to cover the first conductor pattern.

Subsequently, an SiGe mixed crystal semiconductor layer 101 and a cap layer are formed on the second conductor pattern 9 in order with an epitaxial process so as to cover the inner wall of the opening 9a just like in the first embodiment.

Figure 5B:
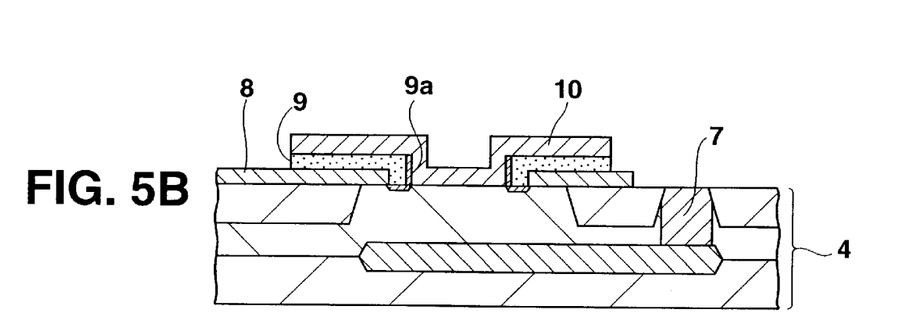

After this, a semiconductor layer 101 and a cap layer are formed in the pattern of the base layer 10 with lithographic and etching processes to obtain the base layer 10 comprising a semiconductor layer 101 as shown in FIG. 5B. At this time, since the second conductor pattern 9 comprises polysilicon whose etch selectivity differs from that of the first conductor pattern 8, the second conductor pattern 9 functions as an etching stopper layer.

Figure 5C:
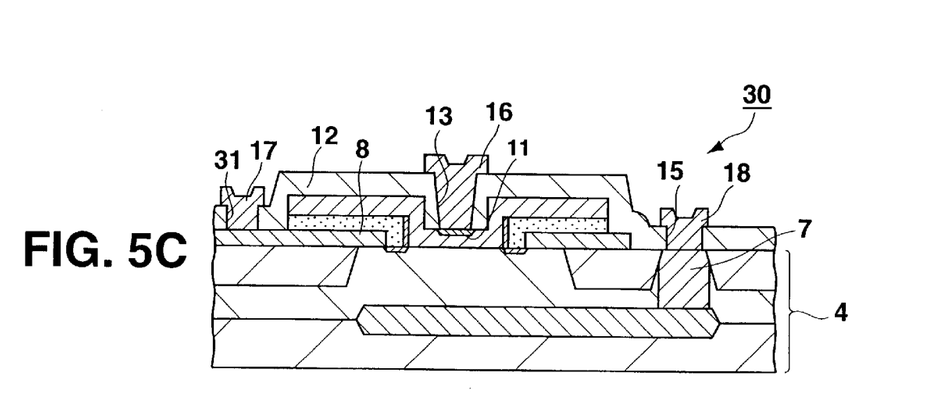

After this, an insulating film 12 is formed on the substrate 4 so as to cover the first conductor pattern 8, the base layer 10, and the edge of the second conductor pattern 9 as shown in FIG. 5C. Then, just like in the first embodiment, the first contact hole 13 is formed in the insulating film 12, an emitter layer 11 is formed, and a contact hole 31 is formed so as to communicate with the first conductor pattern 8, and the third contact hole 15 is formed so as to communicate with the collector lead-out layer 7. Moreover, a base electrode 17 to be connected to the first conductor pattern 8 through the contact hole 31, an emitter electrode 16 to be connected to the emitter layer 11 through the first contact hole 13, and a collector electrode 18 to be connected to the collector lead-out layer 7 through the third contact hole 15 are formed respectively.

The bipolar transistor 30 is manufactured in those steps.

In the method of manufacturing this bipolar transistor 30, a film used for the second conductor pattern 9 is formed with a material whose etch selectivity differs from that of the first conductor pattern 8. Consequently, since the first conductor pattern 8 comprises only an etching stopper layer, etching of the base layer 10 can be controlled very well for patterning the semiconductor layer 101.

In addition, since the base lead-out electrode is formed in the first conductor pattern 8 comprising WSix whose resistance is very low, the resistance of the base lead-out electrode can also be lowered properly.

Consequently, in addition to the effect obtained with the method in the first embodiment, another effect that forming of the low resistance base lead-out electrode can be controlled well in processes can be obtained.

In the case of the method in this embodiment, the base layer 10 is etched up to a position where the first conductor pattern 8 is exposed, but the base layer 10 may also be etched so as to leave the second conductor pattern 9 as is. In this case, since WSix and polysilicon are laminated to form the base lead-out electrode, the resistance of the base lead-out electrode can be lowered properly.

In addition, the second conductor pattern 9 is formed with a material whose etch selectivity differs from that of the second conductor pattern 9 in the above embodiment, the semiconductor layer 101 may be formed with a material whose etch selectivity differs from the second conductor pattern 9, then the second conductor pattern 9 may be used as an etching stopper layer.

Figure 6:
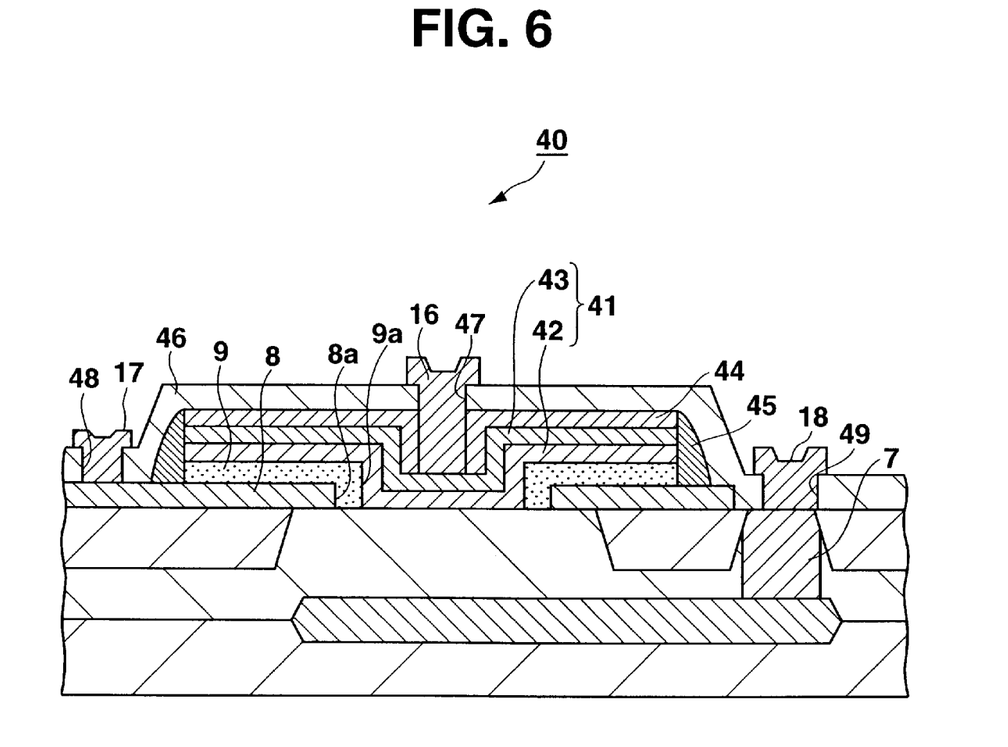
FIG. 6 is a side cross sectional view showing the major portion of the third embodiment of the first semiconductor device according to the present invention.

Subsequently, the third embodiment of the first semiconductor device according to the present invention will be explained with reference to FIG. 6 (side cross sectional view of the major portion).

The difference between the bipolar transistor 1 in the first embodiment and the bipolar transistor 40, which is a semiconductor device explained in this embodiment, is the configuration of the semiconductor layer 41 comprising an epitaxial layer formed on the second conductor pattern 9, and the first conductor pattern 8 formed as a base lead-out electrode.

In other words, the first conductor pattern 8 provided with an opening 8a is formed in the pattern of the base lead-out electrode on the substrate 4. In addition, the second conductor pattern 9 provided with an opening 9a is formed so as to cover the first conductor pattern 8, and on the substrate 4 is formed a semiconductor 41 so as to be connected to the second conductor pattern 9. In this embodiment, a semiconductor layer 41 comprising an epitaxial layer is formed so as to cover the inner wall of the opening 9a and the face of the second conductor pattern 9.

The semiconductor layer 41 formed both in the opening 9a of the second conductor pattern 9 and on the face of the second conductor pattern 9 comprises both a P-type base layer 42 connected to the second conductor pattern 9 and an N⁺-type emitter layer 43 formed on the base layer 42. The base layer 42 comprises, for example, an SiGe mixed crystal and the emitter layer 43 comprises an Si single crystal. And, a cap layer (not illustrated) comprising an Si epitaxial layer is formed between the base layer 42 and the emitter layer 43.

Furthermore, an insulating film 44 is formed on such a semiconductor film 41. On the side wall of a laminated layer comprising the second conductor pattern 9, the semiconductor layer 41, and the insulating layer 44 is formed a side wall 45 comprising, for example, SiOx. This side wall 45 is used to separate the first conductor pattern 8, which is a base lead-out electrode, from the emitter layer 43.

Furthermore, on the substrate 4 is formed an upper insulating film 46 covering both the insulating film 44 and the side wall 45. And, the first contact hole 47 is formed through both the upper insulating film 46 and the insulating film 44 so as to communicate with the emitter layer 43. In the upper insulating film 46 are also formed the second contact hole 48 communicating with the first conductor pattern 8 and the third contact hole 49 communicating with the collector lead-out layer 7 of the substrate 4.

Through the upper insulating layer 46 are formed an emitter electrode 16 connected to the emitter layer 43 through the first contact hole 47, a base electrode 17 connected to the first conductor pattern 8 through the second contact hole 48, and a collector electrode 18 connected to the collector lead-out layer 7 through the third contact hole 49.

Subsequently, the third embodiment of the first method of manufacturing a semiconductor device according to the present invention will be explained with reference to FIG. 7 on the basis of the method of manufacturing the bipolar transistor 40 formed as described above.

Figure 7A:
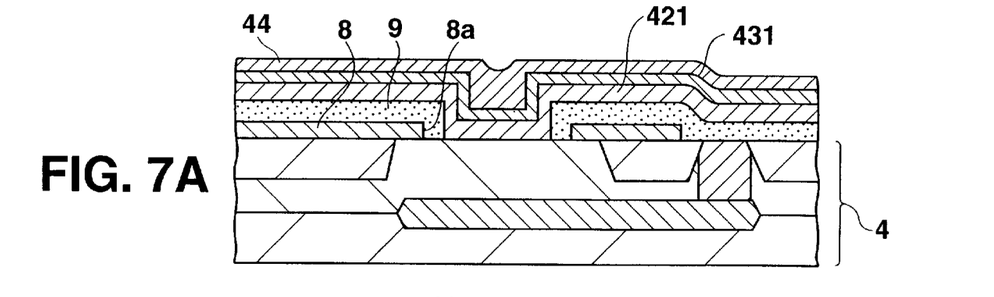
FIG. 7A to FIG. 7D are side cross sectional views of the major portion of the first semiconductor device showing the successive steps in the third embodiment of the first method of manufacturing a semiconductor device according to the present invention.

At first, a WSix film is formed with the CVD method on the substrate 4 prepared with an existing method, then the WSix film is patterned in a shape of the base lead-out electrode to form the first conductor pattern 8 provided with an opening 8a in the collector region as shown in FIG. 7A.

After this, the second conductor pattern 9 provided with an opening 9a in the collector region is formed with the same method as that in the first embodiment so as to cover the first conductor pattern 8. At this time, the second conductor pattern 9 is formed with a material whose etch selectivity differs from that of the first conductor pattern 8, that is, polysilicon.

Then, the first semiconductor layer 421 comprising an SiGe mixed crystal is formed on the second conductor pattern 9 with an epitaxial process so as to cover the inner wall of the opening 9a of the second conductor pattern 9, and a cap layer (not illustrated) comprising Si and the second semiconductor layer 431 comprising Si are formed consecutively.

After this, an insulating film 44 is formed on the substrate 4 with the CVD method so as to cover the second semiconductor layer 431.

Figure 7B:
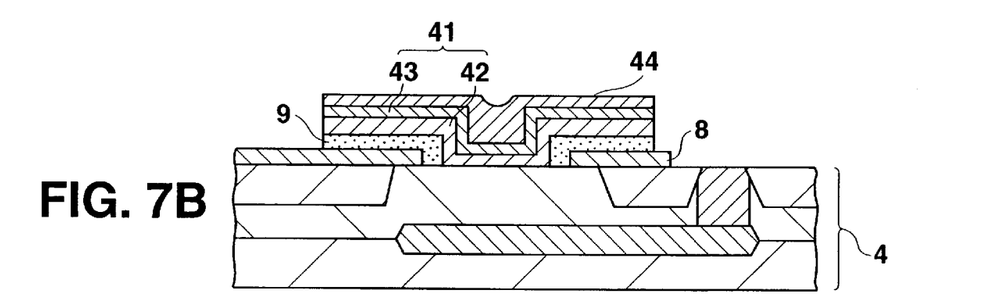

Then, the second conductor pattern 9, the first semiconductor layer 421, the cap layer, the second semiconductor layer 431, and the insulating film 44 are patterned with lithographic and etching processes as shown in FIG. 7B. With this, a semiconductor layer 41 comprising a base layer 42 and an emitter layer 43 are obtained. The base layer 42 comprises the first semiconductor layer 421 and the emitter layer 43 comprises the second semiconductor layer 431. In addition, the emitter layer 43 is separated from the first conductor pattern 8, which is a base lead-out electrode. Since the second conductor pattern 9 is formed with a material whose etch selectivity differs from that of the first conductor pattern 8 in this etching, the first conductor pattern 8 functions as an etching stopper layer.

Figure 7C:
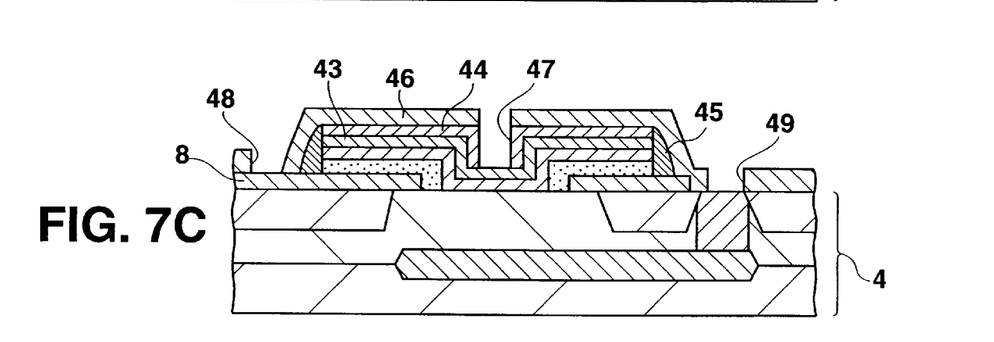

Subsequently, an SiOx film is formed on the substrate 4 so as to cover the first conductor pattern 8, the second conductor pattern 9, the first semiconductor layer 421, the cap layer, and the laminated layer of the second semiconductor layer 431 and the insulating film 44, then the SiOx film is etched back to form a side wall 45 comprising SiOx on the side wall of the above laminated layer as shown in FIG. 7C.

Then, an upper insulating film 46 is formed on the substrate 4 so as to cover the first conductor pattern 8, the insulating film 44, and the side wall 45.

After this, the first contact hole 47 is formed through both the upper insulating film 46 and the insulating film 44 so as to communicate with the emitter layer 43. In addition, the second and third contact holes 48 and 49 are formed through the upper insulating film 46.

Figure 7D:
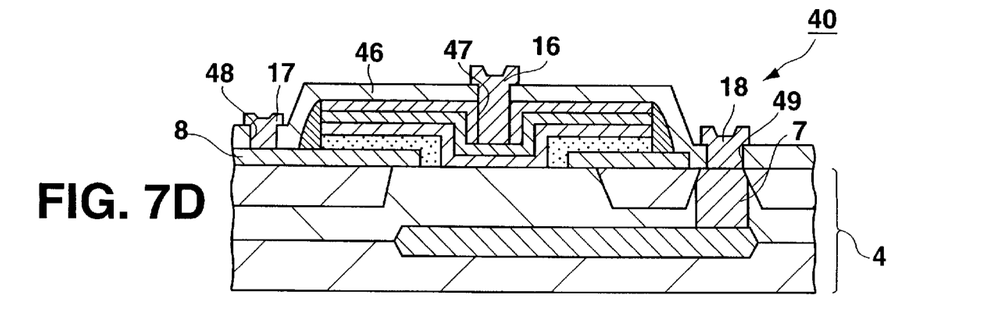

Subsequently, an emitter electrode 16 is formed through the upper insulating film 46 with an existing wiring process so as to be connected to the emitter layer 43 through the first contact hole 47 as shown in FIG. 7D. In addition, a base electrode 17 and a collector electrode 18 are formed. The base electrode 17 is connected to the first conductor pattern 8 assumed to be a base lead-out electrode through the second contact hole 48 and the collector electrode 18 is connected to the collector lead-out layer through the third contact hole 49, respectively.

With the above processes, the bipolar transistor 40 is manufactured.

Also in the method of manufacturing this bipolar transistor 40, at first the first conductor pattern 8 is covered by the second conductor pattern 9 comprising non-metallic polysilicon. Then, both the first and second semiconductor layers 421 and 431 are epitaxial-grown. Consequently, the second conductor pattern 9 functions as a diffusion preventive film, preventing the W of the first conductor pattern 8 from being captured by the first semiconductor layer 421 even when a heat is applied to the substrate 4 during the epitaxial growth. This can prevent a problem that the electrical property of the bipolar transistor 40 is deteriorated by the contamination of the base layer 42 comprising the first semiconductor layer 421.

Furthermore, since the base layer 42 is formed with an SiGe mixed crystal whose band gap is smaller than that of Si and a heterojunction is formed between emitter and base, the electrical property can be prevented from being deteriorated, while the high performance NPN type heterojunction bipolar transistor 40 can be manufactured.

Furthermore, since the second conductor pattern 9 functions as an etching stopper layer when in etching of the semiconductor layer 41, the process controllability can be improved significantly.

Furthermore, the base lead-out electrode is formed in the first conductor pattern 8 comprising WSix whose resistance is very low, so the resistance of the base lead-out electrode can be much lowered.

The high performance NPN type heterojunction bipolar transistor 40 can thus be manufactured.

In the bipolar transistor 40 manufactured such way, the base layer 42 can be formed without being contaminated by the W of the first conductor pattern 8, so this bipolar transistor 40 can be prevented from deterioration of the electrical property to be caused by contamination by the W. Moreover, since the base layer 42 comprises an SiGe mixed crystal and a heterojunction is formed between emitter and base, the high performance NPN type bipolar transistor 40 can be materialized.

In the device and method described in the first to third embodiments, the first semiconductor device of the present invention is an NPN type bipolar transistor. The NPN type transistor may be replaced with a PNP type bipolar transistor, of course. In this case, it is only needed to reverse the conductivity type of the impurities.

In the device and method described in the first and third embodiments, both the semiconductor layer 101 and the first semiconductor layer 421 comprise an SiGe mixed crystal and the second semiconductor layer 431 comprises Si, but the present invention is not limited only to that. The semiconductor layer may also comprise an epitaxial layer.

In addition, although base layers 17 and 42 are formed both in the opening 9a of the second conductor pattern 9 and on the second conductor pattern 9, the base layers 17 and 42 may be formed only in the opening 9a of the second conductor pattern 9.

Furthermore, although the second conductor pattern 9 comprises polysilicon in which impurities are implanted at a high density, the second conductor pattern 9 may also comprise polysilicon in which no impurities are implanted. The second conductor pattern 9 comprising polysilicon in which impurities are implanted at a high density, however, would obtain an effect that enables the resistance between the side wall of the opening 8a of the first conductor pattern 8 and the base layers 17 and 42 to be more lowered.

Subsequently, the first embodiment of the second semiconductor device according to the present invention will be explained with reference to FIG. 8 (side cross sectional view of the major portion). In this embodiment, it is assumed that the second semiconductor device according to the present invention applies to an N channel junction field-effect transistor (hereinafter, the field-effect transistor will be referred as an FET).

Figure 8:
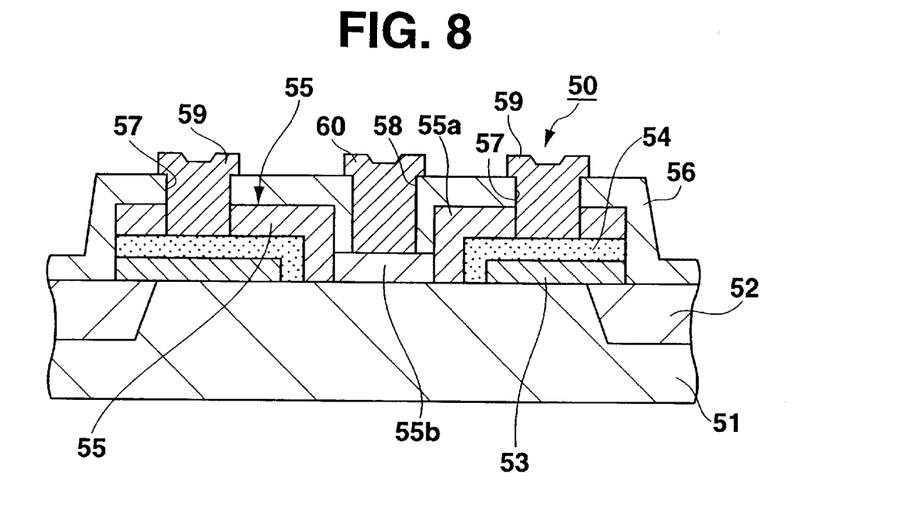
FIG. 8 is a side cross sectional view showing the major portion of an embodiment of the second semiconductor device according to the present invention.

As shown in FIG. 8, in this junction type FET 50, the first conductor patterns 53 are formed with a space left therebetween in a region enclosed by an isolation film 52 on a substrate comprising, for example, a P-type Si substrate. Each of the first conductor patterns comprises a high-melting metallic film or a high-melting metallic compound film. The high-melting metallic film or the high-melting metallic compound film uses the same material as that used for the first conductor pattern 8 described above. In this embodiment, WSix is used to form the first conductor pattern 53.

On the substrate 51 is formed a second conductor pattern 54 for each first conductor pattern 53 so as to cover the pattern 53. The second conductor pattern 54 comprises a non-metallic film, for example, an N+-type polysilicon film in which N-type impurities are implanted at a high density.

On each of the second conductor patterns 54 is formed a semiconductor layer 55 comprising an epitaxial layer so as to cover those second conductor patterns 54. The semiconductor layer 55 is formed with a material such as a mixed crystal of SiGe. On this semiconductor layer 55 are formed N+-type source/drain parts 55a with a space left therebetween so that each of the parts 55a is be connected to each of the second conductor patterns 54. And, a space 55b formed between the source and drain 55a is used to form a channel (hereinafter, this space is to be referred to as a channel part 55b).

On the substrate 51 is formed an insulating film 56 comprising an SiOx film so as to cover the semiconductor layer 55, the edge of the first conductor pattern 53, and the edge of the second conductor pattern 54.

And, a cap layer (not illustrated) comprising an Si epitaxial layer is formed between the semiconductor layer 55 and the insulating film 56.

The first contact hole 57 is formed through both the insulating film 56 and the semiconductor layer 55 so as to be connected to each of the second conductor patterns 54. The second contact hole 58 is also formed through the insulating film 56 so as to be connected to the channel part 55b. And, a source electrode/drain electrode 59 and a gate electrode 60 are formed in the surface of the insulation film 56. The source/drain electrode 59 is formed so as to be connected to both the source/drain part 55a and the second conductor pattern 54 through the first contact hole 57 and the gate electrode 60 is formed so as to be connected to the channel part 55b through the second contact hole 58. Each of those source electrode/drain electrode 59 and the gate electrode 60 comprises, for example, Al metal.

Figure 9A:
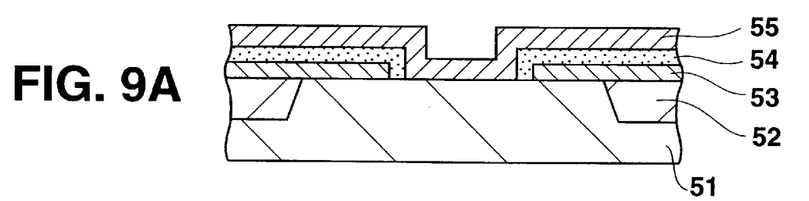
FIG. 9A to FIG. 9C are side cross sectional views of the major portion of the second semiconductor device showing the successive steps in an embodiment of the second method of manufacturing a semiconductor device according to the present invention.

Subsequently, an embodiment of the second method of manufacturing a semiconductor device according to the present invention will be explained with reference to FIG. 9 on the basis of the method of manufacturing the junction type FET 50 formed as described above. Before manufacturing such a junction type FET 50, at first an isolation film 52 is formed on a substrate 51 as shown in FIG. 9A with an existing method.

After this, a WSix film is formed on the substrate 51 with the CVD method, and then the WSix film is patterned with lithographic and etching processes to form the first conductor patterns 53 comprising WSix with a space left between each of the first conductor patterns 53.

After this, a polysilicon film is formed on the substrate 51 so as to cover the first conductor pattern 53 with the CVD method, then N-type impurities are implanted in the polysilicon film entirely at a high density with the ion implantation method. In this case, the N$^+$-type polysilicon film may also be formed by implanting N-type impurities when the polysilicon film is formed with the above CVD method.

After this, the polysilicon film is patterned with lithographic and etching processes to form a second conductor pattern 54 for each first conductor pattern 53 so as to cover the first conductor pattern 53.

Subsequently, a semiconductor layer 55 comprising an SiGe mixed crystal is grown on the substrate 51 selectively with an epitaxial process, then an Si cap layer (not illustrated) is formed on the semiconductor layer 55. The semiconductor layer 55 is thus formed on each second conductor pattern 54 so as to be connected to the second conductor pattern 54.

Figure 9B:
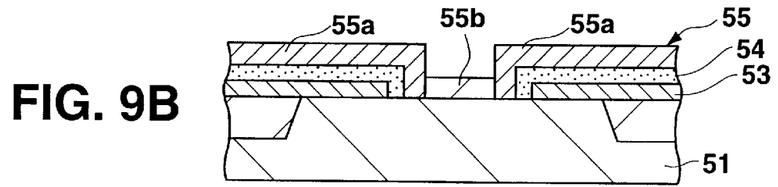

After this, a heat treatment is executed for the semiconductor layer 55 to diffuse the N-type impurities implanted in each second conductor pattern 54 into the semiconductor layer 55 to form N$^+$-type source/drain parts 55a as shown in FIG. 9B. Since the second conductor patterns 54 are formed with a space left therebetween so that each second conductor pattern 54 is assigned to each of the first conductor patterns 53 as described above, the source/drain parts 55a are also formed on the semiconductor layer 55 at intervals. Each of those source/drain parts 55a on the semiconductor layer 55 is assumed to be a channel part 55b.

Figure 9C:
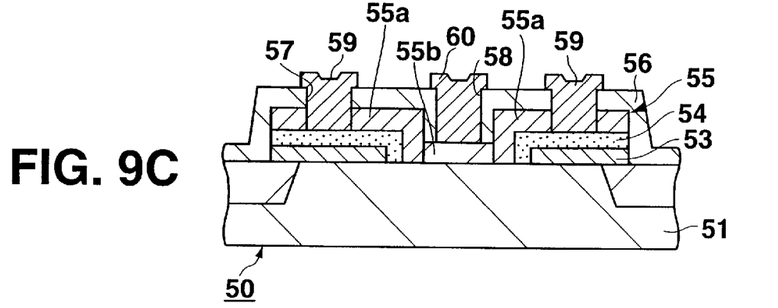

Then, the first conductor pattern 53, the second conductor pattern 54, the semiconductor layer 55, and the cap layer are patterned with the lithographic and etching processes as shown in FIG. 9C.

After this, an insulating film 56 is formed on the substrate 51 with the CVD method so as to cover the first conductor pattern 8, the second conductor pattern 9, and the semiconductor layer 55.

Then, the first contact hole 57 is formed through both the insulating film 56 and the semiconductor layer 55 so as to be connected to each of the second conductor patterns 54 with lithographic and etching processes, and the second contact hole 58 is formed through the insulating film 56 so as to be connected to the channel part 55b of the semiconductor layer 55.

After this, a source electrode/drain electrode 59 and a gate electrode 60 are formed through the insulating film 56. The source electrode/drain electrode 59 is connected to the source/drain parts 55a and the second conductor pattern 54 through the first contact hole 57 and the gate electrode 60 is connected to the channel part 55b through the second contact hole 58. Thus, a junction type FET 50 is formed.

The method of manufacturing this junction type FET 50 can form a shallow and high density source/drain part 55a, since the semiconductor layer 55 can be formed with the epitaxial process.

Moreover, the semiconductor layer 55 is epitaxial-grown on the second conductor patterns 54 after the first conductor patterns 53 are covered by the second conductor patterns 54 comprising non-metallic polysilicon. Consequently, even when heat is applied to the substrate 51 in this epitaxial growth process, the W, which is one of the elements of the first conductor pattern 53, is prevented from being captured by the semiconductor layer 55 due to the second conductor pattern 54 functioning as a diffusion preventive film. As a result, it can prevent a problem that disables the function of the junction type FET 50 due to another problem that keeps the channel part 55b of the semiconductor layer 55 contaminated with metal and keeps the semiconductor layer 55 functioning as a conductor.

In the junction type FET 50 manufactured as described above, the source/drain parts 55a are formed on the semiconductor layer 55 comprising an epitaxial layer. This is why a fine junction type FET 50 provided with shallow and high density source/drain parts 55a can be materialized. The semiconductor layer 55 provided with source/drain parts 55a and channel parts 55b are not contaminated by the W of the first conductor pattern 53, so the electrical property of the FET 50 can be kept as is.

Furthermore, since the source/drain electrode 59 is connected to the first conductor pattern 53 comprising low resistance WSix through the second conductor pattern 54, the resistance of the source/drain electrode 59 can be much reduced.

Consequently, according to the method and the semiconductor device manufactured by the method described in this embodiment, a high performance junction type FET 50 can be materialized.

Although the source/drain parts 55a are formed on the semiconductor 55 by diffusing impurities from the second conductor pattern 54 in the semiconductor layer 55 in the above embodiment, the source/drain parts 55a may also be formed by, for example, ion implantation.

Furthermore, although the second semiconductor device and the second manufacturing method according to the present invention are applied to a junction type FET in the above embodiments, the device and method may also be applied to other FETs.

Figure 10:
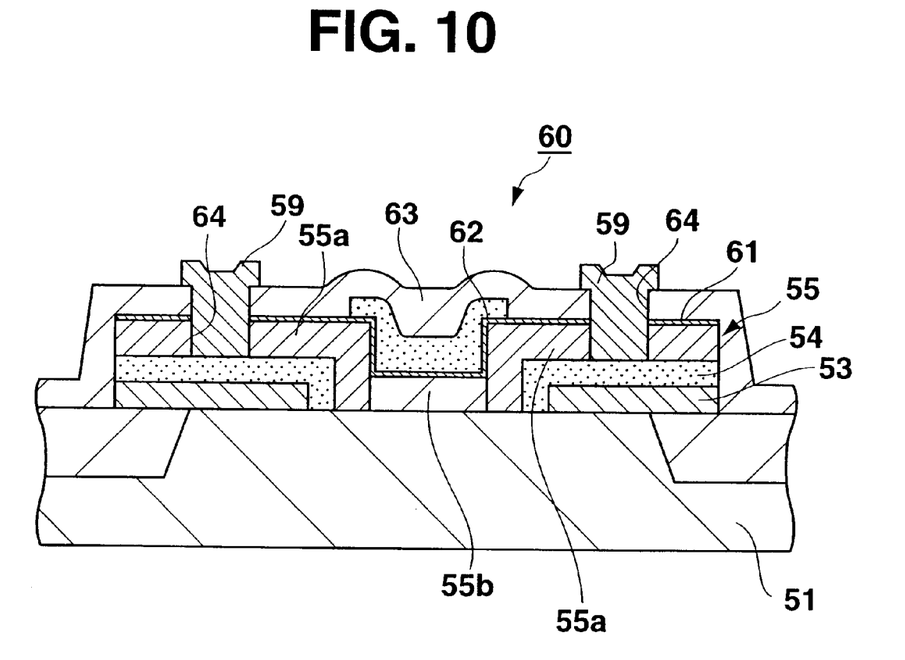
FIG. 10 is a side cross sectional view showing the major portion of a modification of the second semiconductor device according to the present invention.

For example, when the device and method are applied to an N-channel MOSFET, a gate insulating film 61 comprising an SiOx film is formed via a cap layer (not illustrated) comprising an Si epitaxial layer on the semiconductor layer 55 formed just like the above junction type FET 50 shown in FIG. 10. In addition, a gate electrode 62 comprising, for example, polysilicon is formed on the gate insulating film 61 and just above the channel part 55b of the semiconductor layer 55, and on the substrate 51 is formed an insulating film 63 comprising an SiOx film so as to cover the gate insulating film 61 and the gate electrode 62. Then, a contact hole 64 is formed both through the insulating film 63 and through the semiconductor layer 55 so as to communicate with each of the second conductor patterns 54 respectively. In addition, on the insulating film 63 is formed a source/drain electrode 59 connected to both the N$^+$-type source/drain part 55a and the second conductor pattern 54 through the contact hole 64.

In the MOSFET 60 formed as described above, for example, a P⁻-type LDD region may be provided on the channel part 55b side of the source/drain part 55a formed on the semiconductor layer 55.

Furthermore, when manufacturing the MOSFET formed as described above, a cap layer (not illustrated) is formed on the semiconductor layer 55 in the same way as that of the junction type FET 50, then a heat treatment is executed for the semiconductor layer 55 to form N⁺-type source/drain parts 55a on the semiconductor layer 55. After this, a gate insulating film 61 is formed on the semiconductor layer 55 with, for example, the CVD method and the first conductor pattern 53, the second conductor pattern 54, the semiconductor layer 55, the cap layer, and the gate insulating film 61 are patterned with the lithographic and etching processes.

After this, a gate electrode 62, an insulating film 63, a contact hole 64, and a source/drain electrode 59 are formed in order with the same manufacturing method as that of an ordinary MOSFET to obtain the MOSFET 60.

Such the method of manufacturing the MOSFET 60 can assure the same effect as that of the embodiment for the above junction type FET 50.

Although the semiconductor layer 55 comprises an SiGe mixed crystal in the above embodiments, the invention is not limited to the above embodiments. The semiconductor layer 55 may just be an epitaxial layer, for example, an Si layer.

Furthermore, the second claim can also apply to a P-channel FET, although only an N-channel FET is described in the above embodiment. In this case, it is only needed to reverse the conductivity type of impurities.

Furthermore, although the source/drain electrode 59 is connected to the second conductor pattern 54 in the above embodiment, the source/drain electrode 59 may also be connected to the first conductor pattern 53. In this case, the resistance of the source/drain electrode 59 can further be lowered.

As described above, in the first semiconductor device according to the present invention, the semiconductor layer formed on the substrate is formed so as to be protected from contamination by high-melting metal of the first conductor pattern due to the second conductor pattern covering the first conductor pattern. Consequently, when the object semiconductor is a bipolar transistor and the object semiconductor is a base layer, the electrical property is prevented from deterioration caused by the contamination of the base layer by metal.

Furthermore, the resistance of the base lead-out electrode can be much lowered if the first conductor pattern and the second conductor pattern comprise a low resistant high-melting metallic film or a high-melting metallic compound film or the first conductor pattern is a base lead-out electrode. Consequently, the bipolar transistor can be more enhanced while the electrical property is kept properly.

In the second semiconductor device according to the present invention, the semiconductor layer formed on the second conductor pattern is protected from contamination by high-melting metal of the first conductor pattern due to the second conductor pattern covering the first conductor pattern. Consequently, the semiconductor device can be free of the problem that the channel part formed between source/drain parts of the semiconductor layer keeps being a conductor due to the above contamination by metal. Thus, the field-effect transistor can be more enhanced while the electrical property is kept properly.

In the second method of manufacturing a semiconductor device according to the present invention, the semiconductor layer is formed after the first conductor pattern is covered by the second conductor pattern. Thus, the semiconductor is protected from contamination by the high-melting metal of the first conductor pattern. The base layer comprising a semiconductor layer excellent in its electric property can thus be formed if the object semiconductor device is a bipolar transistor.

Furthermore, when the semiconductor layer is formed with a material whose etch selectivity differs from that of the second conductor pattern, the second conductor pattern functions as an etching stopper layer when the semiconductor layer is patterned. In addition, since the second conductor pattern is formed with a material whose etch selectivity differs from that of the first conductor pattern, the first conductor pattern functions as an etching stopper layer when the semiconductor layer and the second conductor pattern are patterned. Therefore, the process controllability can be more improved. Manufacturing of bipolar transistors provided with excellent electrical property and high performance can thus be controlled very well.

In the second method of manufacturing a semiconductor device according to the present invention, the semiconductor layer is formed after each first conductor pattern is covered by the second conductor pattern. Thus, the source/drain part and the channel part formed on the semiconductor layer can be protected from contamination by the high-melting metal of the first conductor pattern. The field-effect transistor can thus be more enhanced while the electrical property is kept properly.

What is claimed is:

1. A semiconductor device, comprising:
    a substrate;
    a first conductor pattern, said first conductor pattern comprising one of a high-melting metallic film and a high-melting metallic compound film formed on said substrate;
    a second conductor pattern, said second conductor pattern comprising a non-metallic film covering at least a portion of a top surface of said first conductor pattern and covering at least one side surface of said first conductive pattern from the top surface to said substrate; and
    a semiconductor layer, said semiconductor layer comprising an epitaxial layer formed on said substrate so as to come in contact with said second conductor pattern.

2. A semiconductor device as claimed in claim 1, wherein said high-melting metallic film is a film selected from molybdenum, tungsten and titanium, and said high-melting metallic compound film is a film selected from molybdenum silicide, tungsten silicide and titanium silicide.

3. A semiconductor device, comprising:
    a substrate;
    a first conductor pattern said first conductor pattern comprising one of a high-melting metallic film and a high-melting metallic compound film formed on said substrate;
    a second conductor pattern, said second conductor pattern comprising a non-metallic film covering said first conductor pattern; and
    a semiconductor layer, said semiconductor layer comprising an epitaxial layer formed on said substrate so as to come in contact with said second conductor pattern, wherein:
    said semiconductor device is a bipolar transistor;
    said semiconductor layer is a first conductivity type base layer; and said base layer includes a second conductivity type emitter layer in a part of said base layer.

4. A semiconductor device, comprising:

a substrate;

a first conductor pattern, said first conductor pattern comprising one of a high-melting metallic film and a high-melting metallic compound film formed on said substrate;

a second conductor pattern said second conductor pattern comprising a non-metallic film covering said first conductor pattern; and a semiconductor layer, said semiconductor layer comprising an epitaxial layer formed on said substrate so as to come in contact with said second conductor pattern, wherein:

said semiconductor device is a bipolar transistor; and said semiconductor layer comprises a first conductivity type base layer and a second conductivity type emitter layer formed on said base layer, said first conductivity type base layer being formed on said substrate so as to come in contact with said second conductor pattern.

5. A semiconductor device as defined in claim 3, wherein at least said first conductor pattern of said first and second conductor patterns is a base lead-out electrode.

6. A semiconductor device as defined in claim 4, wherein at least said first conductor pattern of said first and second conductor patterns is a base lead-out electrode.

7. A semiconductor device, comprising:

field-effect transistor manufactured on a substrate comprising:

first conductor patterns formed on said substrate with a space left between each of said first conductor patterns, each of said first conductor patterns comprising one of a high-melting metallic film and a high-melting metallic compound film;

second conductor patterns, each of said second conductor patterns comprising a non-metallic film formed for each of said first conductor patterns with said second conductor pattern completely covering said first conductor pattern; and a semiconductor layer, said semiconductor layer comprising an epitaxial layer formed on said second conductor patterns so as to come in contact with each of said second conductor patterns, said semiconductor layer having source/drain parts formed therein with a space left between each of said source/drain parts, each of said source/drain parts being connected to each of said second conductor patterns.

8. A semiconductor device, comprising:

a substrate;

a first conductor pattern, said first conductor pattern comprising one of a metallic film and a metallic compound film formed on said substrate, said metallic film being of a refractory metal and said metallic compound film including a refractory metal;

a second conductor pattern, said second conductor pattern comprising a non-metallic film covering at least a portion of a top surface of said first conductor pattern and covering at least one side surface of said first conductive pattern from said top surface to said substrate; and a semiconductor layer, said semiconductor layer comprising an epitaxial layer formed on said substrate so as to come in contact with said second conductor pattern.

9. A semiconductor device, comprising:

a substrate;

a first conductor pattern, said first conductor pattern comprising one of a high-melting metallic film and a high-melting metallic compound film formed on said substrate;

a second conductor pattern, said second conductor pattern comprising a non-metallic film covering at least a portion of a top surface of said first conductor pattern and covering at least one side surface of said first conductive pattern from the top surface to said substrate at a space or opening; and a semiconductor layer, said semiconductor layer comprising an epitaxial layer formed on said substrate after formation of said second conductor pattern so as to come in contact with said second conductor pattern, said epitaxial layer extending through said space or opening in said second conductor pattern to said substrate.

10. A semiconductor device, comprising:

a substrate;

a first conductor pattern, said first conductor pattern comprising one of a metallic film and a metallic compound film formed on said substrate, said metallic film being of a refractory metal and said metallic compound film including a refractory metal;

a second conductor pattern, said second conductor pattern comprising a non-metallic film covering at least a portion of a top surface of said first conductor pattern and covering at least one side surface of said first conductive pattern from said top surface to said substrate at a space or opening in said second conductor pattern; and a semiconductor layer, said semiconductor layer comprising an epitaxial layer formed on said substrate so as to come in contact with said second conductor pattern, said epitaxial layer extending through said space or opening in said second conductor pattern and into contact with said substrate.

* * * * *